United States Patent [19]

Butler

[11] Patent Number: 4,754,441

[45] Date of Patent: Jun. 28, 1988

[54] DIRECTIONAL FLEXTENSIONAL TRANSDUCER

[75] Inventor: John L. Butler, Marshfield, Mass.

[73] Assignee: Image Acoustics, Inc., North Marshfield, Mass.

[21] Appl. No.: 941,106

[22] Filed: Dec. 12, 1986

[51] Int. Cl.[4] ...................... H01L 41/08; H04R 17/00

[52] U.S. Cl. .................................... 367/157; 367/160; 367/168; 310/26; 310/322; 310/334; 310/337

[58] Field of Search ................. 310/26, 322, 334, 337; 367/140, 141, 155, 156, 157, 158, 159, 160, 161, 163, 165, 168

[56] References Cited

U.S. PATENT DOCUMENTS

| | | | |
|---|---|---|---|
| 3,176,262 | 3/1985 | Ehrlich et al. | 330/137 |
| 3,258,738 | 6/1966 | Merchant | 367/158 |
| 3,277,433 | 10/1966 | Toulis | 310/337 X |
| 3,732,535 | 5/1973 | Ehrlich | 367/164 |
| 3,924,259 | 12/1975 | Butler et al. | 310/326 X |
| 4,432,080 | 2/1984 | Wardle | 310/26 X |
| 4,438,509 | 3/1984 | Butler et al. | 310/326 X |
| 4,443,731 | 4/1984 | Butler et al. | 310/26 |
| 4,642,802 | 2/1987 | Pozzo et al. | 310/26 |

*Primary Examiner*—Deborah L. Kyle
*Assistant Examiner*—Brian S. Steinberger

[57] ABSTRACT

A directional flextensional transducer including a transducer shell capable of operation in odd and even drive modes and a transduction drive bar or the like. The transduction drive bar is excited in an even mode to impart extensional motion thereto and is simultaneously excited in an odd mode to impart inextensional motion thereto. The combined excitation causes the flextensional transducer shell to move unidirectionally.

33 Claims, 4 Drawing Sheets

FORCE VECTORS ON THE PIEZOELECTRIC BAR DRIVER
E=EXTENSIONAL , B=BENDING , E,B=BOTH

DIRECTIONAL FLEXTENSIONAL TRANSDUCER

RELATED CO-PENDING APPLICATION

Reference is made herein also to my co-pending application Ser. No. 06/873,961 filed June 13, 1986 and entitled FLEXTENSIONAL TRANSDUCER. Briefly, this prior application describes a transducer adapted to provide large displacements at low acoustic frequencies and comprises multiple curved shells attached to each other at their ends. The shells are driven by a ring or corresponding number of attached piezoelectric or magnetostrictive type rod or bar drivers which together take on the form of a regular polygon. The curved shells are attached to the ends of the drivers and vibrate with a magnified motion as the rods execute extensional motion. As the polygon expands, the curved shells deform and produce additional motion in the same radial direction resulting in large total displacement and corresponding large acoustic output. The resonance of the polygon or ring transducer and the curved shells may be adjusted for broad band operation and extended low frequency performance. Because of the near ring or cylindrical shape of the shell structure, the beam pattern is substantially omnidirectional in the plane of the ring.

BACKGROUND OF THE INVENTION

The present invention relates in general to a flextensional transducer and pertains, more particularly, to a directional flextensional transducer.

A number of so-called flextensional transducer designs have evolved based on the patents of W. J. Toulis, U.S. Pat. No. 3,277,433, "Flexural-Extensional Electromechanical Transducer", Oct. 4, 1966 and H. C. Merchant, U.S. Pat. No. 3,258,738, "Underwater Transducer Apparatus", June 28, 1966. In the invention of Toulis an oval-shaped cylindrical shell is driven along its major axis by a stack of piezoelectric bars resulting in a magnified motion of the shell in the minor axis as driven by the piezoelectric stack. The motions are opposite in phase and the magnification is approximately equal to the ratio of the major to minor axis if the shell is in the shape of an ellipse. In the H. C. Merchant invention the shell is curved inward in a concave way so that the motion along the major axis and the ends is in phase with the motion in the direction of the minor axis.

In the two above-identified patents to W. J. Toulis and H. C. Merchant, the two radiating surfaces are symmetrically arranged on each side of the driving member and consequently moved together, both outward or both inward. Because the radiating surfaces are generally used in environments in which they are small compared to the wavelength of sound in the medium, they are essentially omnidirectional radiators. However, there are situations in which radiation from only one surface is desired. For arrays of elements this inherent omnidirectional radiation or bidirectionality leads to a requirement for a baffle being placed behind the elements. However, this is expensive, and/or cumbersome.

Accordingly, it is an object of the present invention to provide a flextensional transducer that is directional having one side surface that moves with amplified motion while a major portion of the opposite side surface is essentially motionless or of a motion that is inefficient in sound radiation.

Another object of the present invention is to provide a directional flextensional transducer which is simultaneously driven in both odd and even modes so that acoustic radiation emanates mostly from one side only so that the transducer may be utilized in a directional application. In this way an array of these transducers may be used to send sound in one particular direction using one side, without the complications of back radiation from the second side.

For further background also refer to transducers described in U.S. Pat. No. 3,176,262 to S. L. Ehrlich and P. D. Frelich, and U.S. Pat. No. 3,732,535 to S. L. Ehrlich. The transducer in U.S. Pat. No. 3,176,262 is of cylindrical construction while the transducer described in U.S. Pat. No. 3,732,535 is of spherical design. These transducers operate in their extensional modes of vibration.

Still another object of the present invention is to provide a directional flextensional transducer that operates both in extensional and inextensional or bending modes of operation to provide a single-sided flextensional transducer. In accordance with the present invention a flexural shell mode and a particular oscillating body mode are co-excited, as described in further specific detail hereinafter, to produce this single sided flextensional transducer.

SUMMARY OF THE INVENTION

To accomplish the foregoing and other objects, features and advantages of the invention there is provided a directional, flextensional transducer that is adapted to be simultaneously driven in both an odd and even mode whereby the acoustic radiation emanating therefrom is mostly only from one side thereof so that the transducer may be utilized as a directional transducer. The directional flextensional transducer of the invention comprises a translational flextensional transducer shell capable of operation in odd and even drive modes, a transduction drive means, and means coupling the transduction drive means with the translational flextensional transducer shell so as to impart drive thereto. Means are provided for exciting the transduction drive means including first means for exciting the transduction drive means in an even mode to impart extensional motion thereto and second means for simultaneously exciting the transduction drive means in an odd mode to impart inextensional (bending) motion thereto. The combined excitation by the first and second means causes the flextensional transducer shell to move unidirectionally. The transduction drive means may be in the form of a stack of piezoelectric or magnetostrictive members. In one embodiment described herein, the transduction drive means includes two rigid members. The even flextensional transducer shell mode is excited through the extension of the active piezoelectric or magnetostrictive drive stack. The odd mode is excited by also driving the stack in a bending mode which then excites the shell into an odd mode of vibration. In another embodiment of the invention one side of the transducer may be piezoelectric while the other side is magnetostrictive with both members rigidly in contact and both being driven to naturally excite, simultaneously, the extensional and inextensional (bending) modes. In still a further embodiment of the invention the transduction drive means may be comprised of both transduction and non-transduction members.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

As indicated previously, the present invention is directed to a flextensional transducer which is constructed and operated so as to be simultaneously driven in both odd and even modes. The transducer is operated so that acoustic radiation emanates mostly from one side only so that the transducer may be utilized in a directional mode of operation. In this way an array of these transducers may be used to send sound in one particular direction using one side of the transducer without the complications of back radiation from the other side. Furthermore, with the concepts of the present invention this unidirectional operation may be attained without the need for additional components such as baffles or the like.

In accordance with the invention the directionality is accomplished by driving the flextensional transducer shell, not only in its normal fundamental even mode of operation, but also in an odd mode. The even mode of operation of the shell is excited through the extension of the active piezoelectric or magnetostrictive drive stack. This is commonly accomplished through extensional motion along the stack length which is oriented along the major axis of the flextensional transducer. In accordance with the invention, also excited is the odd mode. This is excited by also driving the stack in an inextensional (bending) mode which then excites the shell into an odd mode of vibration. These two modes may be adjusted to operate and resonate at nearly the same frequency.

The inextensional (bending) mode of operation of the piezoelectric or magnetostrictive stack may be excited by driving part of the stack at a different phase from an adjacent part or driving one part at a reduced amplitude. If both halves of the system are driven at the same phase and amplitude, only the conventional even modes are excited. However, if each half is driven out of phase but with the same amplitude, then only the odd modes are excited. If only one half of the stack or bar is driven then both modes are nearly equally excited.

Figure 1:
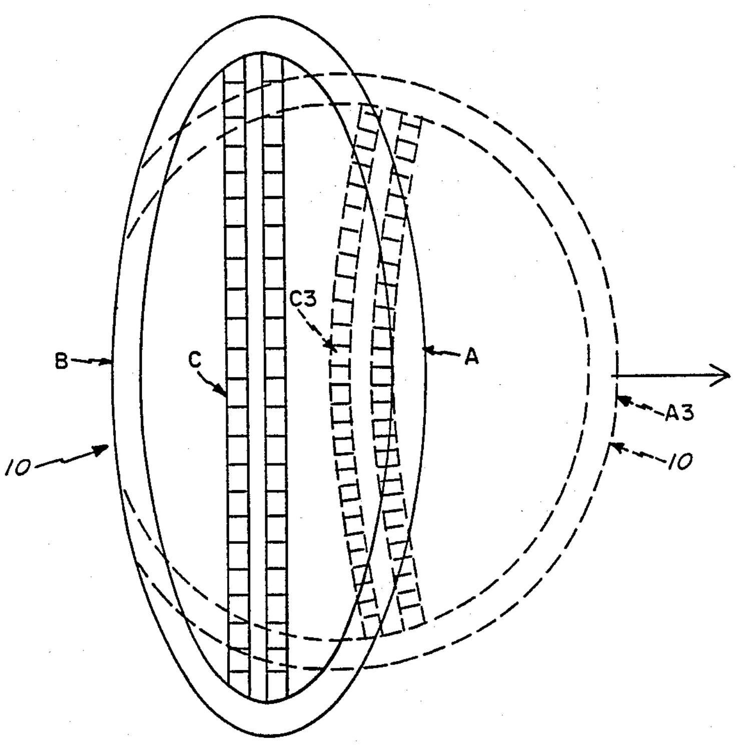
FIG. 1 is a schematic diagram illustrating the principles of the present invention.

Reference is now made to FIG. 1 for an illustration of the basic principals of the invention. In FIG. 1 the flextensional transducer is illustrated in its quiescent state in solid outline. FIG. 1 also illustrates by dashed lines the approximated exaggerated dynamic motion of the transducer as in accordance with the invention. In the illustration of FIG. 1 the transducer comprises a driving stack C that is comprised of piezoelectric or magnetostrictive material. The driving stack is secured to an outer shell for driving the shell. In FIG. 1 the shell is comprised of shell halves A and B.

As illustrated in FIG. 1, the stack C bends in to the shape illustrated at C3 in dotted outline and the right half of the transducer moves to the position A3. At the same time the left shell half B remains essentially stationary. The motion of the transducer from the solid to dotted line position is a result of the odd mode due to the bending of the stack, and the even mode due to the stack linear reduction in length. The result is amplified motion to the right and reduced motion to the left. This thus provides unidirectional transducer operation.

During the next half cycle of drive, the stack moves from the position illustrated in dotted outline toward and past the position illustrated in solid outline. The stack thus expands and also bends in the opposite direction (toward the right in FIG. 1) resulting in the shell half A moving to the left with augmented motion while the shell half B again remains essentially stationary. Thus, by exciting the stack in both its bending and extensional modes the result is amplified motion on one side and reduced or cancelled motion on the second side.

Figures 2A, 2B, 2C:
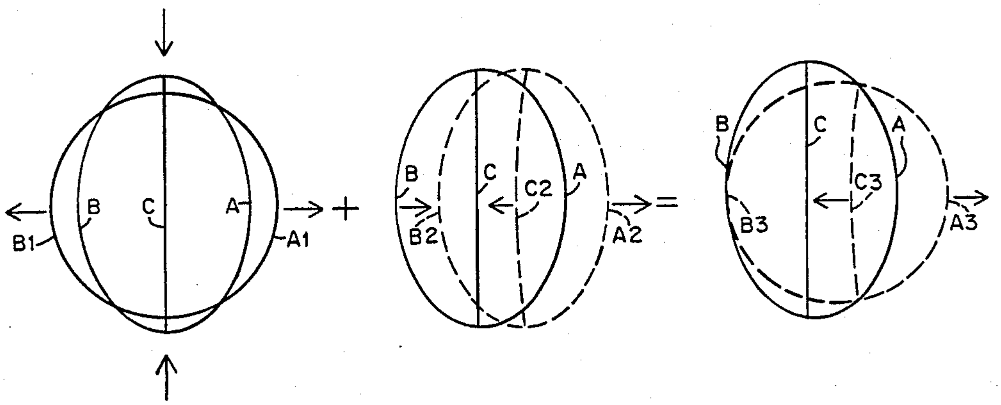
FIG. 2A–C is a second schematic diagram also illustrating the principles of the present invention showing the manner in which the signals are additive and subtractive to provide the unidirectional operation.

The synthesis of the two modes of operation is illustrated in FIG. 2. It is noted that FIG. 2 is comprised of segments (illustrations) 2A and 2B which are additive to provide the resultant illustrated at 2C. The conventional even mode is illustrated in FIG. 2A and shows the two sides halves A and B bending outward to positions A1 and B1 as a result of the reduced length of the transduction drive material of stack C.

FIG. 2B illustrates the excitation of the odd mode by the bending of the beam or stack C to position C2, causing both sides of the shell to move to the right to respective positions A2 and B2.

Finally, in FIG. 2C there is illustrated the resulting motion of combining the motions of FIGS. 2A and 2B. As illustrated, the opposite motions of B1 and B2 essentially cancel leaving no motion at B3 while the motions A1 and A2 are additive. These are illustrated in FIG. 2C by the motion A3.

In FIGS. 1 and 2 there has been illustrated some basic concepts of the invention considering the lowest order even and odd modes of the transducer shell. These are probably the most important modes and can be designed to resonate at the same frequency, thus producing large amounts of motion and substantial power output. In actual practice, higher order modes may also be excited resulting in increased motion and directional output as a result of the simultaneous inextensional (bending) and extensional motion of the transduction bar (stack).

Figure 3:
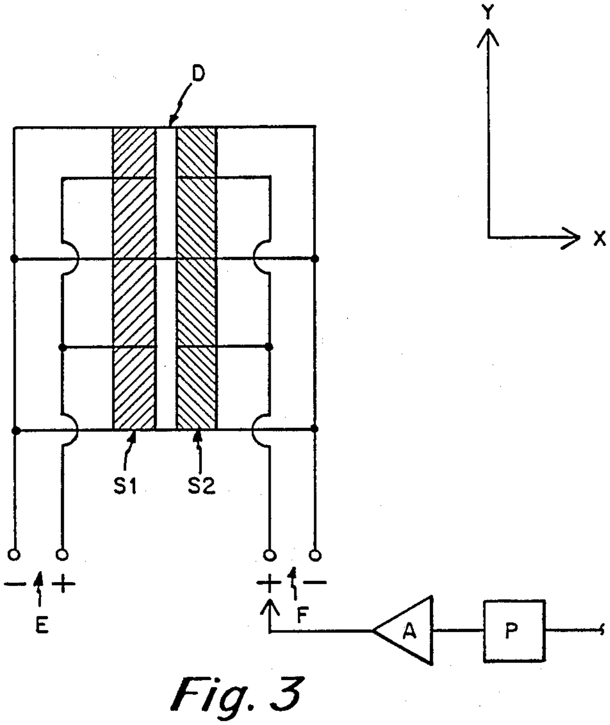
FIG. 3 illustrates one embodiment of the present invention employing a pair of piezoelectric or magnetostrictive bars or the like, driven by respective control signals to provide the aforementioned even and odd motion operation.
Figure 4:
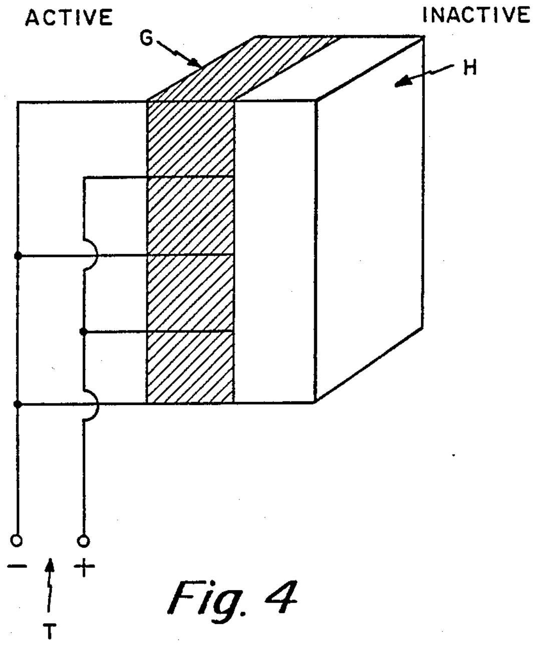
FIG. 4 shows an alternate embodiment of the present invention employing both active and non-active members.

The excitation of the bar bending mode and the resulting shell odd mode excitation may be carried out by driving the bar in a non-symmetrical manner, such as by the means illustrated in FIG. 3 or FIG. 4. In these illustrations only the driver is illustrated, it being understood that the ends of the driver couple to the shell and that the shell is typically in elliptical shape with the bar being along the major axis thereof. With regard to the directions noted in FIG. 3, the extensional motion of the bar is along the Y axis direction which is the direction of the major axis of the transducer which, as mentioned previously, is typically in the form of an ellipse.

If, in FIG. 3, both of the sides of the driver, identified as sides S1 and S2 in FIG. 3, are driven with voltages of the same amplitude and phase, the motion of each side is the same and no bending results. However, if the voltage at terminals E is different in phase or amplitude in comparison to the voltage at terminals F, there is then an unequal extension of the sides S1 and S2 causing bending of the bar. In FIG. 3 it is noted that the stacks S1 and S2 are separated by a layer D which is an electrical insulator disposed between the electrodes of the left and right sides.

Reference is now made to FIG. 4 for an illustration of another version of the transducer driver. In FIG. 4 the driving stack is provided in two separate halves, one an active half G and the other an inactive half H. The non-active material may be an insulated metal or inactive ceramic. In this embodiment, driving of the stack G by a drive voltage at terminals T also results in unequal extension again causing bending.

Figure 5:
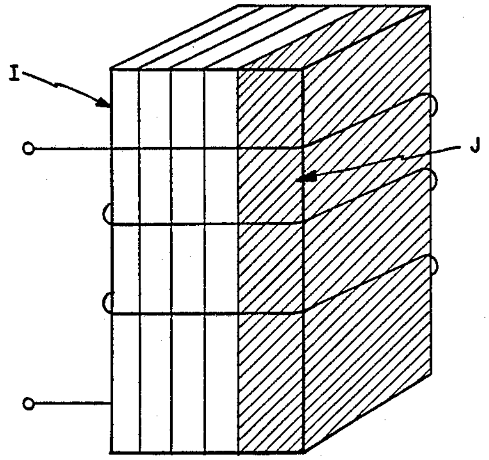
FIG. 5 illustrates still a further embodiment of the present invention employing both an inactive material and a magnetostrictive material.

FIG. 5 illustrates a drive mechanism similar to the one illustrated in FIG. 4 but employing magnetostrictive material in place of the piezoelectric material of FIG. 4. In FIG. 5 the stack J is the inactive material and the stacks I represent magnetostrictive material.

In FIG. 3 in this dual piezoelectric drive system, by selection of proper voltage signals at terminals E and F one may adjust the proper portion of the extensional and bending modes of the stack, causing the shell to move in a superposition of the even and odd modes. This may be accomplished by controlling the phase difference or the amplitude ratio or both. This is illustrated very schematically by the amplifier A and the phase shifter P. In this regard, also refer to FIG. 7 for a more specific circuit of the drive arrangement for the piezoelectric bar. In FIG. 3 when both signals at terminals E and F are of the same phase only extensional motion is excited and consequently only the even mode of the shell is excited. If, on the other hand, the signals at terminals E and F are 180° out of phase, only the bar bending mode and odd shell mode is excited.

The equal excitation of both extension and bending modes of operation thus occurs when both drives are operating at a phase difference of 90°. In this regard, refer to the waveform of FIG. 8 which shows the bar sides being driven at a relative phase of 90°. Also note in FIG. 8 a corresponding bar diagram illustrating the forces applied.

Figure 8:
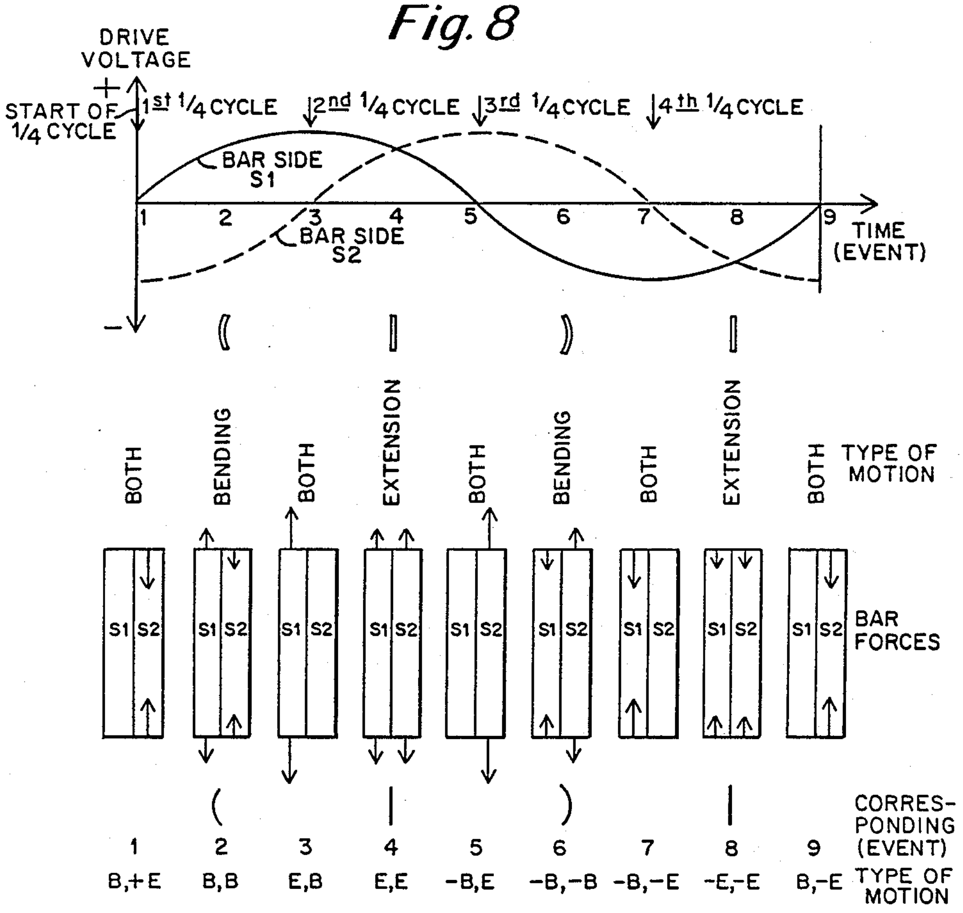
FIG. 8 illustrates voltage waveforms and force diagrams associated with the circuit of FIG. 7.

In addition to the waveform illustrated in FIG. 8, also described are the bar forces on the drive stack. In this connection also refer to FIG. 3. In this case side S2 in FIG. 3 at one point in time is driven with a maximum negative voltage (which causes, say, an inward force) while at that same instant side S1 receives no voltage. One quarter cycle later, side S2 receives no voltage but side S1 receives a maximum but positive voltage (and outward force). In the following further quarter cycle, the first side S2 now receives a maximum but positive voltage while the second side S1 receives no voltage. In the subsequent quarter cycle, side S2 receives no voltage but side S1 receives a maximum and negative voltage. Also shown in FIG. 8 are the intermediate motions between the above discussed quarter cycle phases. The intermediate cases are seen to be pure bending or pure extensional, as indicated.

This entire process repeats in each cycle as long as a repetitive drive, such as a sinusoidal drive voltage is employed. In this instance a gradual role reversal takes place throughout the cycle. This is clearly illustrated in FIG. 8 where opposite bending occurs 180° apart and similarly opposite extension also occurs 180° apart with reference to the wave forms of FIG. 8. Thus, with regard to the employment of FIG. 3, at the initial part of the first quarter cycle, side S2 contracts but since layer D and side S1 are in solid contact, there is a bending of the plate or beam in addition to contraction. On the next quarter cycle side S1 expands in length also causing a continuation of the bending process as well as an increase in length. On the third quarter cycle side S2 expands while side S1, being undriven, causes the beam to bend in the opposite direction along with the extension. Finally, in the fourth quarter cycle side S1 is caused to contract (because of the negative voltage) assisting in the further bending, again since side S2 receives no voltage and no extension of motion, but because of the solid contact between side S1 and side S2 and layer D causing a bending of the composite beam (or plate) in addition to the contraction.

As indicated previously, the extensional component excites the even modes while the bending (or inextensional) component of the drive stack excites the odd modes. Because of possible differences in the electromechanical coupling of the stack and shell, or the difference in radiation loads, an additional adjustment may be needed to achieve maximum motion (or output) on one side and minimum motion on the other side of the shell. This adjustment in motion may be accomplished by adjusting the magnitude of the drive voltage ratio. In this regard refer to FIG. 7 and the circuit including the amplifiers $G_A$ and $G_B$.

Figure 6:
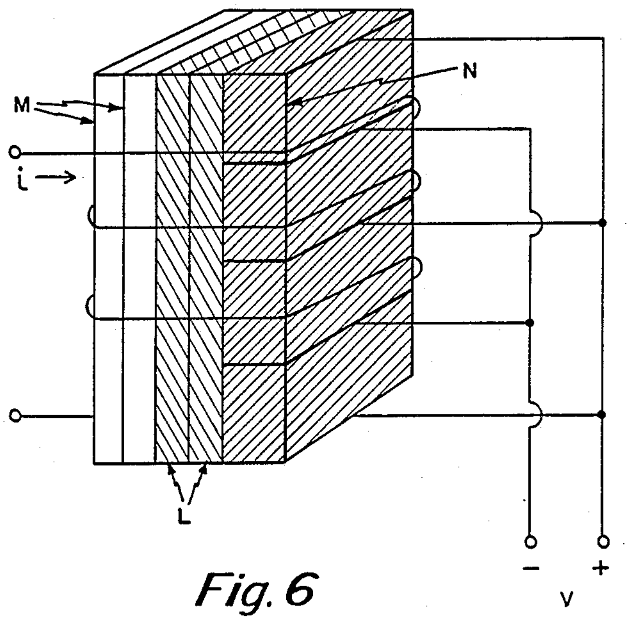
FIG. 6 is a final embodiment of the present invention employing a magnetostrictive member, a piezoelectric member and an insulator member.

An alternate embodiment of the invention is illustrated in FIG. 6. FIG. 6 combines both a magnetostrictive system illustrated at M in a piezoelectric system illustrated at N along with the use of an insulator L disposed therebetween. The advantage of this embodiment is that these systems have an electromechanical operation that have 90° phase relative to each other and thus no phase shifter is necessary. Another advantage occurs if one transduction mechanism is used to electrically tune the other. The amplitude ratio of electrical drives may be adjusted by the number of coil turns on the magnetostrictive driver or the number of electrodes on the piezoelectric driver. The use of the magnetostrictive rear earth alloys such as Terfernol D allows nearly the same characteristics for each drive mechanism.

Figure 7:
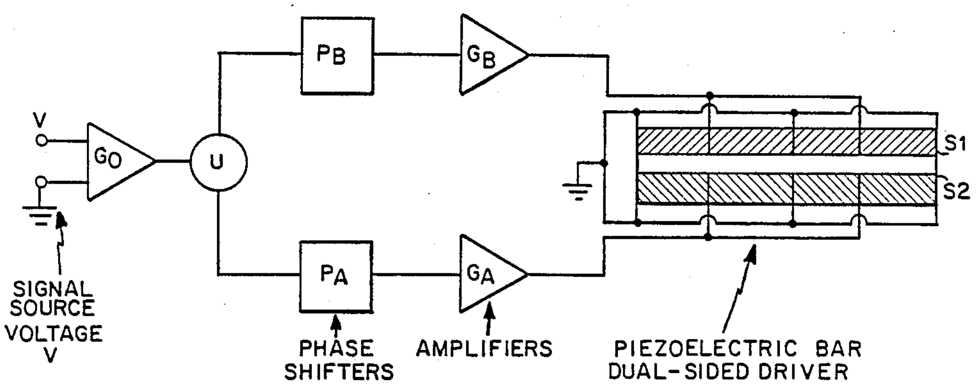
FIG. 7 is a more detailed diagram of a circuit for driving the transducer, such as the version of FIG. 3.

FIG. 7 illustrates a circuit that may be employed to provide the voltage drive signals as illustrated in FIG. 8. This circuit has an input sinusoidal voltage applied at terminal V coupled by way of amplifier $G_0$ to a divider U. The signal is from there divided and couples to the phase shifters $P_A$ and $P_B$. From there the signals are coupled by way of the aforementioned amplifiers to the driver. Again, by adjusting the phase shifters the wave form of FIG. 8 may be obtained in order to provide the preferred 90° difference drive.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. A directional flextensional transducer comprising;

a flextensional transducer shell capable of operation in odd and even modes, and having one side and an other side circumscribing a closed locus a transduction drive means, having opposed ends means symmetrically connecting the transduction drive means at its opposed ends to the flextensional transducer shell at spaced predetermined locations on the shell so as to enable operative drive of the shell, and means for exciting said transduction drive means including first means for exciting said transduction drive means in an even mode to impart extensional motion thereto so as to, in turn, cause the shell to move with an even bending motion, second means for exciting said transduction drive means in an odd mode to impart inextensional bending motion thereto so as to, in turn, cause the shell to move with translational motion in an odd bending shell mode, and means for controlling said first and second means to cause the flextensional transducer shell to be simultaneously excited in both odd and even modes causing said one side of the flextensional transducer shell to move with greater motion than said other side to, in turn, cause unidirectional shell motion.

2. A directional flextensional transducer as set forth in claim 1 wherein said transduction drive means includes a beam.

3. A directional flextensional transducer as set forth in claim 1 wherein said transduction drive means includes a plate.

4. A directional flextensional transducer as set forth in claim 1 wherein said transduction drive means includes two rigid members constructed of one of piezoelectric and magnetostrictive material.

5. A directional flextensional transducer as set forth in claim 4 wherein said first means includes means for exciting a first of the two rigid members said second means includes means for exciting a second of the two rigid members, each said rigid member comprising a stack of piezolectric or magnetostrictive elements.

6. A directional flextensional transducer as set forth in claim 5 wherein the first and second rigid members are driven at a phase difference of 90° to provide excitation of both extension and bending modes.

7. A directional flextensional transducer as set forth in claim 5 wherein the first and second rigid members are driven with one of different phase and amplitude signals to excite both extension and bending modes.

8. A directional flextensional transducer as set forth in claim 4 wherein one rigid member is a piezoelectric and the other rigid member is magnetostrictive.

9. A directional flextensional transducer as set forth in claim 8 including means for commonly holding both the piezoelectric and magnetostrictive members rigidly in relative contact, both members being driven to excite, simultaneously, the extensional and bending modes.

10. A directional flextensional transducer as set forth in claim 1 wherein said transduction drive means includes at least two transduction members and an inactive member.

11. A directional flextensional transducer as set forth in claim 1 wherein the combined excitation one side of the translation flextensional transducer shell to move with greater motion than the other side.

12. A directional flextensional transducer as set forth in claim 1 wherein said transduction drive means include at least one transduction member of a material of one of piezoelectric and magnetostrictive material, and an in-active member.

13. A directional flextensional transducer as set forth in claim 12 wherein the in-active member is comprised of an insulated metal.

14. A directional flextensional transducer as set forth in claim 12 wherein the in-active member is comprised of an inactive ceramic.

15. A directional flextensional transducer as set forth in claim 12 wherein the means for excitation includes separate means for simultaneously exciting the transduction member and in-active member.

16. A directional flextensional transducer as set forth in claim 1 wherein said transduction drive means includes a piezoelectric member and a magnetostrictive member separated by an insulator member.

17. A method of operating a flextensional transducer to provide unidirectional motion, said flextensional transducer comprising a flextensional transducer shell capable of operation in odd and even drive modes and having one and an other side, a tranduction drive means having opposed ends, and means for connecting the transduction drive means at its opposed ends to the flextensional transducer shell at spaced predetermined locations on the shell so as to enable operative drive of the shell, said method comprising the steps of, exciting said transduction drive means in even mode to impart extensional motion thereto so as to, in turn, cause the shell to move with an even bending motion, and simultaneously exciting the transduction drive means in an odd mode to impart inextensional bending motion thereto so as to in turn caues the shell to move with translational motion, while controlling the relative phase of odd and even mode excitation so as to provide signal cancellation on said one shell side and signal addition on said other shell side to thereby cause the flextensional transducer shell to move unidirectionally.

18. A directional flextensional transducer comprising, a flextensional transducer shell capable of operation in odd and even modes and having one and an other side, a transduction driver having opposed ends, means connecting the transduction driver at its opposed ends to the flextensional transducer shell at spaced predetermined locations on the shell so as to enable operative drive of the shell, and means for exciting said transduction driver to provide excitation thereof simultaneously in an even mode to impart extensional motion thereto so as to, in turn, cause the shell to move with bending motion, and in an odd mode to impart inextensional motion thereto so as to, in turn, cause, the shell to move with translational motion, whereby the flextensional transducer shell is driven in simultaneous even and odd modes causing said one side of the flextensional transducer shell to move with greater motion than said other side to, in turn, cause unidirectional shell motion.

19. A directional flextensional transducer as set forth in claim 18 wherein said transduction driver includes a beam.

20. A directional flextensional transducer as set forth in claim 18 wherein said transduction driver includes a plate.

21. A directional fextensional transducer as set forth in claim 18 wherein said transduction driver includes two rigid members constructed of one of piezoelectric and magnetostrictive material.

22. A directional flextensional transducer as set forth in claim 21 wherein said means for exciting said transduction driver includes means for exciting the first of said two rigid members and means for exciting a second of the two rigid members, each said rigid member comprising a stack of piezoelectric or magnetostrictive elements.

23. A directional flextensional transducer as set forth in claim 22 wherein the first and second rigid members are driven at a phase difference of 90° to provide excitation of both extension and ending modes.

24. A directional flextensional transducer as set forth in claim 22 wherein the first and second rigid members are driven with one of different phase and amplitude signals to excite both extension and vending modes.

25. A directional flextensional transducer as set forth in claim 21 wherein one rigid member is piezoelectric and the other rigid member is magnetostrictive.

26. A directional flextensional transducer as set forth in claim 25 including means for commonly holding both the piezoelectric and magnetostrictive members rigidly in relative contact, both members being driven to excite, simultaneously, the extensional and bending modes.

27. A directional flextensional transducer as set forth in claim 18 wherein said transduction driver includes at least two transduction members and an inactive member.

28. A directional flextensional transducer as set forth in claim 18 wherein the flextensional transducer shell has one and the other sides and the combined excitation causes one side of the flextensional transducer shell to move with greater motion than the other side.

29. A directional flextensional transducer as set forth in claim 18 wherein said transduction driver includes at least one transduction member of a material of one of piezoelectric and magnetostrictive material and an inactive member.

30. A directional flextenional transducer as set forth in claim 29 wherein the inactive member is comprised of an insulated metal.

31. A directional flextensional transducer as set forth in claim 29 wherein the inactive member is comprised of an inactive ceramic.

32. A directional flextensional transducer as set forth in claim 29 wherein the means for exciting includes separate means for simultaneously exciting the transduction driver and inactive member.

33. A directional flextensional transducer as set forth in claim 18 wherein said transduction driver includes a piezoelectric member and a magnetostrictive member separated by an insulator member.

* * * * *